US007656218B2

(12) United States Patent
Kurokawa et al.

(10) Patent No.: US 7,656,218 B2
(45) Date of Patent: Feb. 2, 2010

(54) SIGNAL OUTPUT CIRCUIT AND SEMICONDUCTOR INTEGRATED CIRCUIT

(75) Inventors: Gentaro Kurokawa, Atsugi (JP); Nagayoshi Dobashi, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/703,432

(22) Filed: Feb. 7, 2007

(65) Prior Publication Data

US 2007/0188217 A1 Aug. 16, 2007

(30) Foreign Application Priority Data

Feb. 15, 2006 (JP) ............................ 2006-038659

(51) Int. Cl.
*H03L 5/00* (2006.01)

(52) U.S. Cl. ........................... 327/333; 326/67; 326/74; 326/78; 326/80; 326/81

(58) Field of Classification Search .................. 327/333
See application file for complete search history.

(56) References Cited

U.S. PATENT DOCUMENTS 3,938,108 A 2/1976 Salsbury et al.
4,527,079 A * 7/1985 Thompson ................... 326/78
4,543,499 A * 9/1985 Kaneko et al. .............. 326/100
5,025,180 A * 6/1991 Kim et al. ...................... 326/78
5,045,729 A * 9/1991 Yee et al. ....................... 326/78

FOREIGN PATENT DOCUMENTS

EP 1 359 562 A2 11/2003
EP 1 691 483 A2 8/2006
JP 2000-244301 9/2000

OTHER PUBLICATIONS

Patent Abstracts of Japan of JP 2000-244301 dated Sep. 8, 2000.

* cited by examiner

*Primary Examiner*—Lincoln Donovan
*Assistant Examiner*—John W Poos
(74) *Attorney, Agent, or Firm*—Ladas and Parry LLP

(57) ABSTRACT

A signal output circuit is disclosed that supplies a signal from a first circuit that is driven based on a first reference voltage to a second circuit that is driven based on a second reference voltage. The signal output circuit includes a first control circuit that draws a current to the first reference voltage according to an output signal from the first circuit and supplies a signal to the second circuit according to the drawn current, and a second control circuit that draws a current from the second circuit to the second reference voltage.

4 Claims, 4 Drawing Sheets

113
111
Vcc=+5V
FIRST CIRCUIT 112
V01=0V
V02=Vee=-5V
121
122
131
R11
Q11
Q12
Q13
R12
Tout
Q21
Q22
Q23
R21
R22

SIGNAL OUTPUT CIRCUIT AND SEMICONDUCTOR INTEGRATED CIRCUIT

BACKGROUND OF THE INVENTION

1. Field of the Invention

The present invention relates to a signal output circuit and a semiconductor integrated circuit that are configured to output a signal from a first circuit that is driven based on a first reference signal to a second circuit that is driven based on a second reference signal.

2. Description of the Related Art

An IIL (integrated injection logic) circuit is a low-power logic circuit that is fabricated by a bipolar process. An IIL circuit can normally be integrated with an analog circuit by performing an analog process (e.g., see Japanese Laid-Open Patent Publication No. 2000-244301). In this case, a system may be configured in which an output signal of the IIL circuit controls the analog circuit. In such an integrated circuit, the output signal of the IIL circuit has to be input to the analog circuit.

FIGS. 4A and 4B are block diagrams illustrating exemplary configurations of integrated circuits. FIG. 4A shows an integrated circuit with a reference voltage V01 set to 0 V, and FIG. 4B shows an integrated circuit with a reference voltage V02 set to 5 V.

In these drawings, it is assumed that a first circuit 1 corresponds to an IIL circuit and a second circuit 2 corresponds to an analog circuit. In FIG. 4A, where the reference voltage V01 is set to 0 V, the first circuit 1 generates a signal based on the reference signal V01, and the signal generated at the first circuit 1 is supplied to the second circuit 2.

The second circuit 2 is an analog circuit that is controlled by the signal from the first circuit 1. In FIG. 4A where the reference voltage V01 is set to 0 V, the second circuit 2 is driven based on the reference voltage V01.

Similarly, in FIG. 4B where the reference voltage V02 is set to 5 V, the first circuit 1 and the second circuit 2 use the reference voltage V02 as a common reference voltage.

However, it is noted that a high-level output of an IIL circuit is normally 0.7 V and a low-level output of the IIL circuit is normally 0 V. On the other hand, a power supply voltage Vcc of an analog circuit is normally +5 V and the reference voltage of the analog circuit is normally −5 V. Therefore, when an integrated circuit is configured in the manner illustrated in FIGS. 4A and 4B, design alterations have to be made in at least one of the ILL circuit or the analog circuit.

SUMMARY OF THE INVENTION

According to an aspect of the present invention, a signal output circuit and a semiconductor integrated circuit are provided in which plural circuits that are driven based on different reference voltages may be easily integrated.

According to one embodiment of the present invention, a signal output circuit is provided that supplies a signal from a first circuit that is driven based on a first reference voltage to a second circuit that is driven based on a second reference voltage, the circuit including:

a first control circuit that draws a current to the first reference voltage according to an output signal from the first circuit, and supplies a signal to the second circuit according to the drawn current; and a second control circuit that draws a current from the second circuit to the second reference voltage.

In one preferred embodiment, the first control circuit includes a first transistor that draws a current to the first reference voltage according to the output signal from the first circuit, and a second transistor that supplies a current to the second circuit according to the current drawn by the first transistor.

In another preferred embodiment, the second control circuit includes a third transistor that draws the current from the second circuit to the second reference voltage.

In another preferred embodiment, the first reference voltage is a ground voltage, and the second reference voltage is a negative voltage.

In another preferred embodiment, the first circuit is an IIL circuit that is driven based on the first reference voltage; and the second circuit is an analog circuit that is driven based on the second reference voltage.

According to another embodiment of the present invention, a semiconductor integrated circuit is provided that includes:

a first circuit that is driven based on a first reference voltage;

a second circuit that is driven based on a second reference voltage;

a first control circuit that draws a current to the first reference voltage according to an output signal from the first circuit; and a second control circuit that draws a current from the second circuit to the second reference voltage.

According to one aspect of the present invention, by providing between a first circuit and a second circuit a first control circuit that draws a current to the first reference voltage according to an output signal from the first circuit and supplies a signal to the second circuit according to the drawn current, and a second control circuit that draws a current from the second circuit to the second reference voltage, a signal from the first circuit that is driven based on a first reference voltage may be supplied the second circuit that is driven based on a second reference voltage.

DETAILED DESCRIPTION OF THE PREFERRED EMBODIMENTS

In the following, preferred embodiments of the present invention are described with reference to the accompanying drawings.

[Configuration]

Figure 1:
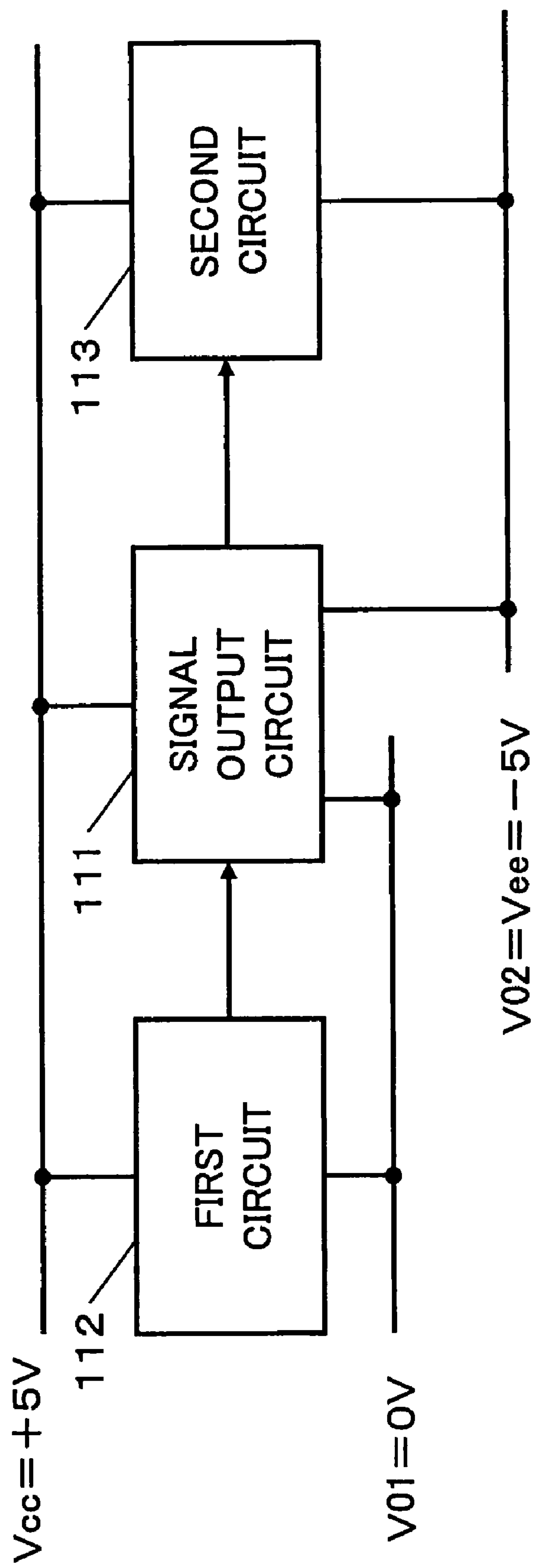
FIG. 1 is a block diagram showing a configuration of an integrated circuit according to an embodiment of the present invention.
Figure 2:
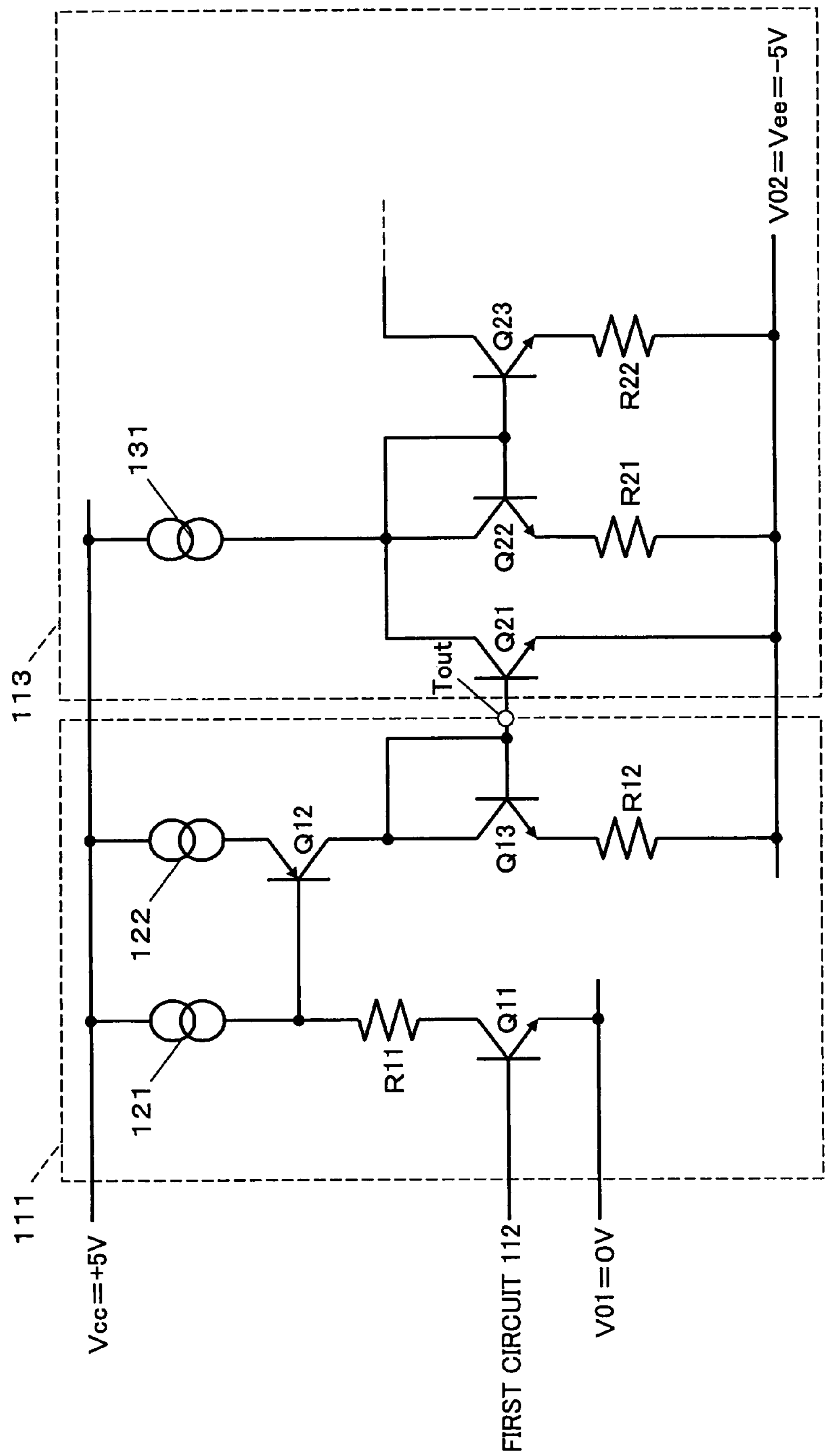
FIG. 2 is a circuit diagram of a signal output circuit according to an embodiment of the present invention.

FIG. 1 is a block diagram showing a configuration of an integrated circuit according to an embodiment of the present invention. FIG. 2 is a circuit diagram of a signal output circuit 111 according to an embodiment of the present invention.

The signal output circuit 111 according to the present embodiment is configured to convert a signal from a first circuit 112 that is based on a first reference voltage V01 of 0 V, for example, into a second reference voltage V02 of −5 V, for example, and supply the converted signal to a second circuit 113. The first circuit 112 may be an IIL circuit or a TTL circuit, for example. It is noted that a power supply voltage Vcc of +5 V, for example, and the first reference voltage V01 of 0 V, for example, are applied to the first circuit 112. In this case, the first circuit 112 is driven based on a voltage of 5 V corresponding to the voltage difference between the power supply voltage Vcc and the first reference voltage V01. The output signal of the first circuit 112 is based on the first reference voltage V01, and its voltage may be 0 V at low-level and +0.7 V at high-level.

The second circuit 113 may be an analog circuit that is controlled by an IIL circuit, for example. It is noted that a power supply voltage Vcc of +5 V, for example, and a second reference voltage V02 of −5 V, for example, are applied to the second circuit 113. In this case, the second circuit 113 is driven by a voltage of 10 V corresponding to the voltage difference between the power supply voltage Vcc and the second reference voltage V02.

The signal output circuit 111 is configured to convert the reference voltage of a signal to be supplied from the first circuit 112 to the second circuit 113 from the first reference voltage V01 to the second reference voltage V02. It is noted that the power supply voltage Vcc of +5 V, for example, the first reference voltage V01 of 0 V, for example, and the second reference voltage V02 of −5 V, for example, are applied to the signal output circuit 111.

As is shown in FIG. 2, the signal output circuit 111 includes constant current sources 121, 122, transistors Q11, Q12, Q13, and resistors R11 and R12.

The constant current sources 121, 122, the transistors Q11, Q12, and the resistor R11 form a first control circuit that draws a current to the first reference voltage V01 according to the output signal from the first circuit 112 and supplies a current to the second circuit 113 according to the drawn current. The transistor Q13 and the resistor R12 form a second control circuit that draws a current to the second reference voltage from the second circuit 113.

It is noted that the power supply voltage Vcc is applied to the constant current sources 121 and 122. The constant current sources 121 and 122 generate constant currents from the power supply voltage Vcc and outputs the generated constant currents.

The constant current output by the constant current source 121 is supplied to a collector of the transistor Q11 via the resistor R11. The transistor Q11 is made up of a NPN transistor having an emitter connected to the first reference voltage V01 and a base to which a logic output signal is supplied. The first reference voltage V01 may be at ground level, namely, 0 V, for example. The low level voltage of the logic output signal may be at ground level and the high level voltage of the logic output signal may be at approximately 0.7 V. The transistor Q11 may be turned off when the logic output signal supplied to the base is at low level and turned on when the logic output signal is at high level.

The current output from the constant current source 122 is supplied to an emitter of the transistor Q12. The transistor Q12 may be made up of a PNP transistor having a base that is connected to the connection point between the constant current source 121 and the resistor R11, and a collector that is connected to an output terminal Tout and the collector and base of the transistor Q13.

The transistor Q13 may be made up of a NPN transistor having a base that is connected to a collector. The collector and the base of the transistor Q13 is connected to the collector of the transistor Q12, and an emitter of the transistor Q13 is connected to the second reference voltage V02 via the resistor R12. It is noted that a current is not supplied to the collector and base of the transistor Q13 when the transistor Q12 is turned off so that the transistor Q13 is turned off. Thus, when the transistor Q12 is turned off, the base voltage of the transistor Q13 may be approximately equal to the second reference voltage V02. For example, the second reference voltage may be a voltage Vee that is equal to −5 V. It is noted that the collector and the base of the transistor Q13 correspond to outputs of the signal output circuit 111.

The resistor R11 is configured to control the current so that the transistor Q12 may not enter a saturation area when the transistors Q11 and Q13 are turned on.

[Operations]

Figures 3A, 3B:
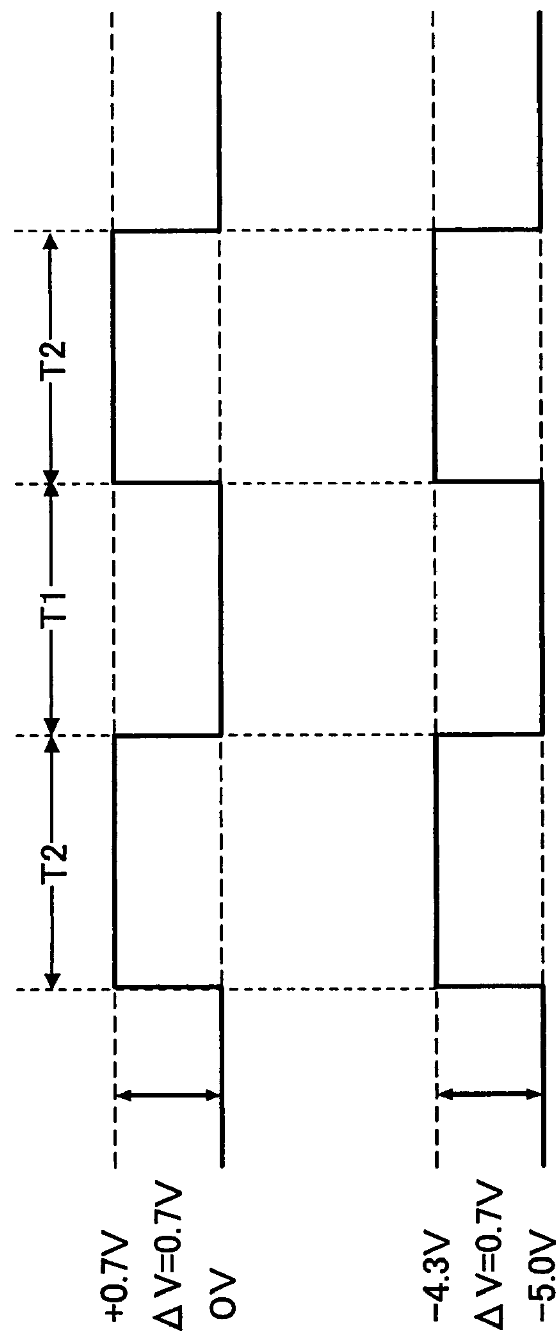
FIGS. 3A and 3B are diagrams illustrating operational waveforms of the signal output circuit.
Figure 4A:
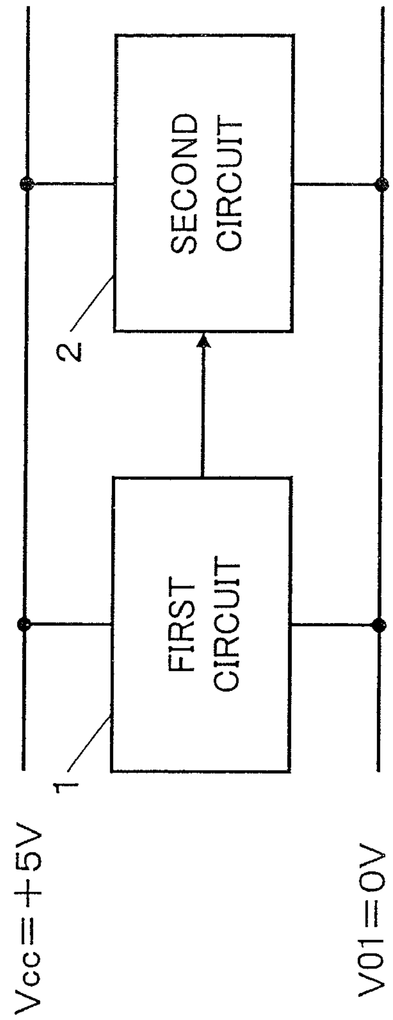
FIGS. 4A and 4B are diagrams showing exemplary configurations of integrated circuits.
Figure 4B:
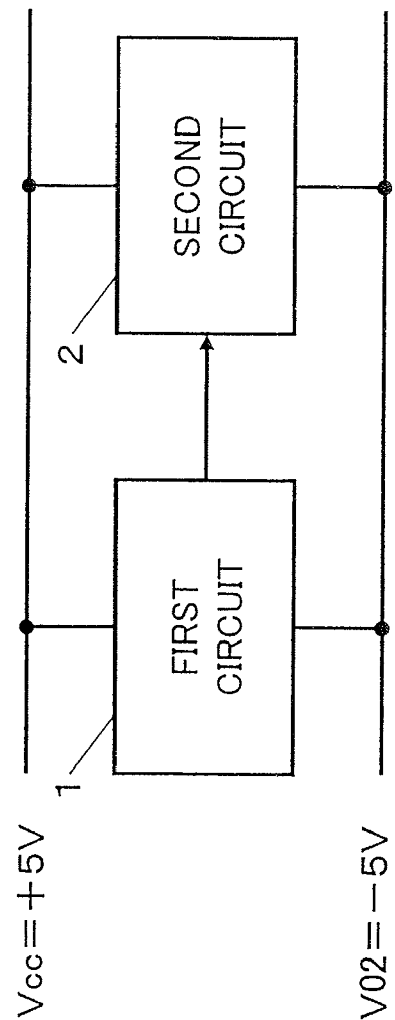

FIGS. 3A and 3B are diagrams showing operational waveforms according to an embodiment of the present invention. Specifically, FIG. 3A illustrates the operational waveform of an input signal of the signal output circuit 111, and FIG. 3B illustrates the operational waveform of an output signal of the signal output circuit 111.

During time period T1 as is shown in FIG. 3A, the output signal of the first circuit 112 is at a low level of 0 V. In this case, the base voltage of the transistor Q11 may be 0 V so that the transistor Q12 is turned off.

When the transistor Q11 is turned off, the current from the constant current source 121 is supplied to the base of the transistor Q12 so that the base potential of the transistor Q12 rises. The transistor Q12 is turned off in response to the rise in base potential of the transistor Q12.

When the transistor Q12 is turned off, the supply of the current from the constant current source 122 to the collector and base of the transistor Q13 is stopped. When the supply of current from the constant current source 122 to the transistor Q13 is stopped, the voltage of the base of the transistor Q13 becomes approximately equal to the second reference voltage V02 of −5 V. Since the base of the transistor Q13 corresponds to the output of the signal output circuit 111, the output of the signal output circuit 111 may be approximately −5 V, as is shown in FIG. 3B.

During period T2 as is shown in FIG. 3A, the output signal of the first circuit 112 is at a high level of 0.7 V. In this case, the base voltage of the transistor Q11 becomes 0.7 V so that the transistor Q11 is turned on.

Upon being turned on, the transistor Q11 draws current from the base of the transistor Q12 so that the base potential of the transistor Q12 decreases, and in turn, the transistor Q12 may be turned on.

When the transistor Q12 is turned on, a current is supplied from the constant current source 122 to the base of the transistor Q13. In this way, the base voltage of the transistor Q13 rises to high level.

In this case, the base voltage of the transistor Q13 may be −4.3 V, which is equal to a voltage that is obtained by increasing the second reference voltage V02 of −5 V by the transistor base-emitter voltage of 0.7 V. Since the base of the transistor Q13 corresponds to the output of the signal output circuit 111, the output of the signal output circuit 111 is approximately −4.3 V as is shown in FIG. 3B.

As is described above, the base of the transistor Q13 corresponds to the output of the signal output circuit 111 and is connected to the base of the transistor Q21 making up an input circuit of the second circuit 113. The transistor Q21 is made up of a PN transistor that has a collector connected to a constant current source 131 and an emitter connected to the second reference voltage V02.

The constant current source 131 generates a constant current from the power supply voltage Vcc, and supplies the generated constant current to the collector of the transistor Q21, the collector and base of the transistor Q22, and the base of the transistor Q23. The emitter of the transistor Q22 is connected to the second reference voltage V02 via the resistor R21, and the emitter of the transistor Q23 is connected to the second reference voltage V02 via the resistor R22.

It is noted that the transistor Q22 and the transistor Q23 form a current mirror circuit wherein a current corresponding to the current flowing within the collector of the transistor Q22 is drawn from the transistor Q23.

The transistor Q21 is turned on when the base of the transistor Q13 is at high level. In this case, the transistor Q21 draws a current from the constant current source 131 to the second reference voltage V02. When the base of the transistor Q13 is low level, the transistor Q21 is turned off.

When the transistor Q21 is turned on, the current from the constant current source 131 flows through the transistor Q21 and is supplied to the second reference voltage V02. In this case, a current is not supplied to the current mirror circuit formed by the transistors Q22 and Q23, and a current is not drawn from the collector of the transistor Q23.

When the transistor Q21 is turned off, the current from the constant current source 131 is supplied to the current mirror circuit formed by the transistors Q22 and Q23 so that the current mirror circuit may be driven. In this way, a current may be drawn from the collector of the transistor Q23.

As can be appreciated, according to the above-described embodiment, the collector current of the transistor Q23 is controlled according to a signal from the first circuit 112, and in turn, the second circuit 113 is controlled.

According to the present embodiment, an output signal of the first circuit 112 that is driven based on the first reference voltage V01 of 0 V may be transmitted to the second circuit 113 that is driven based on the second reference voltage V02 of −5 V via the signal output circuit 111. In this way, the first circuit 112 and the second circuit 113 may be used as they are without having to implement specific design alterations thereon. That is, by providing the signal output circuit between the first circuit 112 and the second circuit 113, for example, an IIL circuit with a high level output of 0.7 V and a low level output of 0 V and an analog circuit with a reference voltage V02 of −5 V may be integrated without implementing specific design alterations. In this way, plural circuits that are driven based on differing reference voltages may be easily integrated.

Also, it is noted that in the present embodiment the signal output circuit 111 may be realized by a relatively inexpensive and simple circuit configuration that is made up of the current sources 121, 122, the three transistors Q11-Q13, and the resistors R11 and R12.

Further, it is noted that the present invention is not limited to the specific embodiments described above, and variations and modifications may be made without departing from the scope of the present invention.

The present application is based on and claims the benefit of the earlier filing date of Japanese Patent Application No. 2006-038659 filed on Feb. 15, 2006, the entire contents of which are hereby incorporated by reference.

What is claimed is:

1. A signal output circuit that supplies a signal from a first circuit that is driven based on a first reference voltage to a second circuit that is driven based on a second reference voltage, the circuit comprising:

a first control circuit that draws a current from a constant current source to the first reference voltage according to an output signal from the first circuit, and supplies a signal to the second circuit according to the drawn current; and a second control circuit that draws a current from the constant current source to the second reference voltage, wherein the first control circuit includes a first transistor that draws a current to the first reference voltage according to the output signal from the first circuit, and a second transistor that supplies a current to the second circuit according to the current drawn by the first transistor, wherein the first transistor is configured to draw the current to the first reference voltage when the output signal from the first circuit is at a high level and is configured to be turned off when the output signal from the first circuit is at a low level, and wherein the first reference voltage is a ground voltage, and the second reference voltage is a negative voltage.

2. The signal output circuit as claimed in claim 1, wherein the second control circuit includes a transistor that draws the current from the second circuit to the second reference voltage.

3. The signal output circuit as claimed in claim 1, wherein the first circuit is an IIL circuit that is driven based on the first reference voltage; and the second circuit is an analog circuit that is driven based on the second reference voltage.

4. A semiconductor integrated circuit comprising:

a first circuit that is driven based on a first reference voltage;

a second circuit that is driven based on a second reference voltage;

a first control circuit that draws a current from a constant current source to the first reference voltage according to an output signal from the first circuit; and a second control circuit that draws a current from the constant current source to the second reference voltage, wherein the first control circuit includes a first transistor that draws a current to the first reference voltage according to the output signal from the first circuit, and a second transistor that supplies a current to the second circuit according to the current drawn by the first transistor, wherein the first transistor is configured to draw the current to the first reference voltage when the output signal from the first circuit is at a high level and is configured to be turned off when the output signal from the first circuit is at a low level, and wherein the first reference voltage is a ground voltage, and the second reference voltage is a negative voltage.

* * * * *